United States Patent [19]
Parrillo et al.

[11] Patent Number: 4,745,086
[45] Date of Patent: May 17, 1988

[54] REMOVABLE SIDEWALL SPACER FOR LIGHTLY DOPED DRAIN FORMATION USING ONE MASK LEVEL AND DIFFERENTIAL OXIDATION

[75] Inventors: Louis C. Parrillo; Stephen J. Cosentino; Richard W. Mauntel, all of Austin, Tex.

[73] Assignee: Motorola, Inc., Schaumburg, Ill.

[21] Appl. No.: 47,589

[22] Filed: May 11, 1987

Related U.S. Application Data

[63] Continuation of Ser. No. 780,535, Sep. 26, 1985, abandoned.

[51] Int. Cl.[4] .................. H01L 21/26; H01L 21/265; H01L 21/22
[52] U.S. Cl. ........................................ 437/57; 437/29; 437/37; 437/44; 437/149; 437/154; 437/247; 148/DIG. 82; 148/DIG. 106; 148/DIG. 116; 357/42; 357/91
[58] Field of Search ............. 437/29, 27, 37, 44, 437/57, 58, 149, 150, 154, 238, 239, 985, 913, 933; 148/DIG. 3, 30, 76, 82, 83, 106, 116, 163; 357/42, 91

[56] References Cited
U.S. PATENT DOCUMENTS

| | | | |
|---|---|---|---|
| 4,282,539 | 8/1981 | Schrader | 357/23 |
| 4,356,623 | 11/1982 | Hunter | 29/571 |
| 4,422,885 | 12/1983 | Brower et al. | 148/1.5 |
| 4,474,624 | 10/1984 | Mathews | 148/1.5 |
| 4,480,375 | 11/1984 | Cottrell et al. | 29/576 B |
| 4,488,348 | 12/1984 | Jolly | 29/571 |
| 4,488,351 | 12/1984 | Momose | 29/578 |
| 4,519,126 | 5/1985 | Hsu | 29/571 |
| 4,525,920 | 7/1985 | Jacobs et al. | 29/571 |
| 4,530,150 | 7/1985 | Shirato | 29/576 B |
| 4,536,944 | 8/1985 | Bracco et al. | 29/571 |
| 4,561,170 | 12/1985 | Doering et al. | 29/571 |
| 4,590,663 | 5/1986 | Haken | 29/571 |

FOREIGN PATENT DOCUMENTS 5526548  9/1981  Japan .................. 357/42

OTHER PUBLICATIONS

E. Bassous, et al., "Self-Aligned Polysilicon Gate MOSFETS with Tailored Source and Drain Profiles," *IBM Technical Disclosure Bulletin*, vol. 22, No. 11, Apr. 1980, pp. 5146–5147.

P. J. Tsang, et al. "Fabrication of High-Performance LDDFET'S with Oxide Sidewall Spacer Technology," *IEEE Journal of Solid State Circuits*, vol. SC-17, No. 2, Apr. 1982, pp. 220–226.

E. Takeda, et al. "Submicrometer MOSFET Structure for Minimizing Hot Carrier Generation," *IEEE Transactions on Electron Devices*, vol. ED-29, No. 4, Apr. 1982, pp. 611–618.

S. Ratham, et al. "An Optimized 0.5 Micron LDD Transistor," *International Electron Devices Meeting Papers*, vol. 10.2, 1983, pp. 237–241.

Y. Matsumoto, et al. "Optimized and Reliable LDD Structure for 1 mm NMOSFET Based on Substrate Current Analysis," *International Electron Devices Meeting Papers*, vol. 15.4, 1983, pp. 392–395.

*Primary Examiner*—Brian E. Hearn
*Assistant Examiner*—William Bunch
*Attorney, Agent, or Firm*—John A. Fisher; Jeffrey Van Myers; David L. Mossman

[57] ABSTRACT

A method of using removable sidewall spacers to minimize the need for mask levels in forming lightly doped drains (LDDs) in the formation of CMOS integrated circuits. Aluminum or chemical vapor deposition (CVD) metals such as tungsten are suitable materials to form removable sidewall spacers which exist around CMOS gates during heavily doped source/drain region implants. Other materials such as CVD polysilicon may also be useful for the sidewall spacers. The sidewall spacers are removed before implantation of the lightly doped drain regions around the gates. This implantation sequence is exactly the reverse of what is currently practiced for lightly doped drain formation. The invention also includes the use of a differential oxide layer. A second set of disposable sidewall spacers or the use of permanent sidewall spacers form optional embodiments.

10 Claims, 3 Drawing Sheets

4,745,086

REMOVABLE SIDEWALL SPACER FOR LIGHTLY DOPED DRAIN FORMATION USING ONE MASK LEVEL AND DIFFERENTIAL OXIDATION

This is a continuation of application Ser. No. 780,535, filed Sept. 26, 1986, abandoned.

CROSS-REFERENCE TO RELATED APPLICATION

This application is related to U.S. patent application Ser. No. 780,534, filed on Sept. 26, 1985, now abandoned, which relates to removable sidewall spacers for lightly doped drain formation using two mask levels.

FIELD OF THE INVENTION

The invention concerns the manufacture of CMOS integrated circuits, and more particularly concerns the formation of lightly doped drains (LDDs) during CMOS integrated circuit manufacture.

BACKGROUND OF THE INVENTION

In the formation of fine-line metal oxide semiconductor (MOS) devices, a recurring and severe problem is hot carrier instability (HCI). This problem occurs due to high electrical fields between the source and the drain, particularly near the drain that cause carriers, either electrons or holes, to be injected into the gate or substrate. The injection of hot carriers into the gate can cause gate oxide charging and threshold voltage instabilities which accumulate over time and greatly degrade device performance.

This problem has been addressed by attempting to reduce the strength of the electric field near the source and the drain regions. One approach concerns using a graded drain structure. For instance, in an n-channel device, a heavily doped drain of phosphorous or arsenic surrounded by a lighter doping of phosphorous is used to gradually extend the drain region into the channel region to reduce the electric field strength right at the drain. However, this approach is undesirable in that it causes larger overlap capacitance with the gate, larger lateral diffusion and channel shortening. Merely the deeper junction of the drain produces more disadvantageous short channel effects, such as an abrupt dropoff of threshold voltage with $L_{eff}$.

With deeper junctions, there is a wider subsurface depletion effect and it is easier for the field lines to go from the drain to the source, which causes "punch-through current" problems and shorts out the device.

A more satisfactory solution to the hot carrier instability problems concerns the use of lightly doped drains (LDDs). LDDs consist of a lightly doped source/drain region that is driven just under the gate region, while the heavily doped drain region is laterally displaced away from the gate by use of a sidewall spacer on the gate. LDDs are particularly advantageous because they do not have problems with excess lateral or vertical impurity diffusion. For a discussion of various approaches to minimizing HCI effects, see E. Takeda, et al. "Submicrometer MOSFET Structure for Minimizing Hot-Carrier Generation," *IEEE Transactions on Electron Devices*, Vol. ED-29, No. 4, April 1982, pp. 611–618.

Lightly doped drains have been studied most extensively in connection with n-channel MOS devices (NMOS) where the HCI problems are most severe. Some limited work has been done on using LDDs with p-channel devices (PMOS) where they provide drain to source punchthrough or short channel protection. For both types of devices the LDD structure has small lateral diffusion under the gate.

The lightly doped regions are implanted after the gate has been etched and prior to sidewall formation. The sidewall spacer is formed by first depositing a dielectric after the gate has been etched and then removing the dielectric from the horizontal regions, namely, the top of the gate, and the source and drain regions, using anisotropic etching, such as reactive ion etching (RIE). This process results in a sidewall spacer left behind on the gate sidewalls that has a roughly quarter-circular cross-section. For a description of this procedure, see Y. Matsumoto, et al. "Optimized and Reliable LDD Structure for 1um NMOSFET Based on Substrate Current Analysis," *International Electron Devices Meeting Papers*, Vol. 15.4, 1983, pp. 392–395. See also U.S. Pat. No. 4,356,623. The spacer is typically a dielectric that remains on the gate sidewall through the final process. After sidewall spacer formation, a heavy source/drain implant is typically done with the gate and spacer acting as masking materials. Consequently, the heavily doped source and drain regions are laterally displaced from the gate edges by the thickness of the sidewall spacer material.

However, to form LDDs on complementary MOS integrated circuits (CMOS) which contain both NMOS and PMOS devices, the obvious technique for putting LDDs on the p-channel and n-channel devices would require the use of four lithographic steps using two different protective resist masks, which is an undesirably large number. The four steps would be an n+ mask after gate etch, a p− mask, n+ mask (which may be the same as the n+ mask) after sidewall formation and a p+ mask (which may be the same as the p− mask). In addition to a large number of masking steps required in this straightforward approach, this technique requires that the p− region under the spacer of the PMOS gate will receive the same thermal cycle that the n− region receives at the end of the four implants. This will be deleterious to PMOS transistor behavior in that a large lateral diffusion of p− region under the gate of the PMOS device will produce short channel effects. In other words, greater underdiffusion, greater overlap capacitance and deeper p− junctions will occur along with the accompanying short channel effects, etc. Therefore, it would be desirable to provide a technique to incorporate LDDs in both n-channel and p-channel devices on a CMOS structure that requires only one or two mask levels and in addition, that separates the thermal cycles of n-type and p-type source/drain regions.

S. Ratham, et al. in "An Optimized 0.5 Micron LDD Transistor," *International Electron Devices Meeting Papers*, Vol. 10.2, 1983, pp. 237–241, describe a procedure for making LDDs where a lithographed photoresist layer protects the gate during implantation of the heavily doped source/drain regions and is then removed for the implantation of the LDD areas. Even though the protective photoresist mask is removable, the LDD formation step is not a self-aligned one and the number of mask levels required to implement LDDs in CMOS circuits would be undesirably high.

SUMMARY OF THE INVENTION

Accordingly, it is an object of the present invention to provide a technique for forming lightly doped drains in both or either n-channel and p-channel devices in a CMOS integrated circuit.

Another object of the invention is to provide a procedure for the formation of LDDs in CMOS devices which requires only one mask level and one lithographic step.

Still another object of the present invention is to provide a method for the formation of LDDs in CMOS devices in which the n-type and p-type source/drain regions may be driven in by separate thermal cycles.

Yet another object of the invention is to provide a one-mask technique for forming LDDs in CMOS devices which will optionally permit the use of permanent sidewall spacers at the end of the process.

Another object of the invention is to provide a method for forming LDDs in CMOS devices which gives the option of forming a p$^-$ short channel effect resistance pocket in the NMOS devices present.

In carrying out these and other objects of the invention, there is provided, in one form, a process for forming LDDs on devices in MOS integrated circuits involving first forming gates for the MOS devices on an integrated circuit substrate. Next, disposable, cleanly removable sidewall spacers are formed along the gate edges, after which a disposable barrier material is formed over selected gates. Heavily doped source/drain regions are subsequently implanted along the sidewall spacer edges of the gates not covered by the disposable barrier material while the remaining gates are protected by the disposable barrier material. Next, the disposable sidewall spacers are removed from along the edges of the gates having the heavily doped source/drain regions, after which LDD regions are selectively implanted along the edges of the gates having the heavily doped source/drain regions. Finally, the disposable barrier material is removed from over all of the selected gates, and the source/drain regions along the gate edges are driven in by a thermal drive-in cycle.

DETAILED DESCRIPTION OF THE INVENTION

Figure 1A:
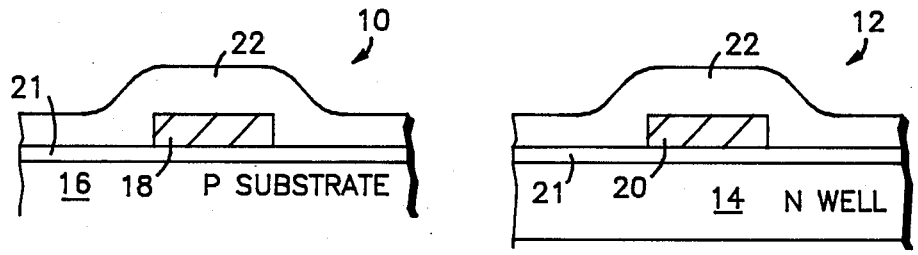
FIGS. 1A through 1H are schematic, cross-sectional illustrations showing the various stages of the process of this invention as LDDs are introduced in the formation of source/drains in NMOS and PMOS devices of a CMOS integrated circuit.

Shown in FIG. 1A is the first step in the formation of the disposable, cleanly removable sidewall spacers which are a key element of this invention. N-channel device 10 and p-channel device 12 have already been started as seen by the formation of the n-type well 14 in substrate 16. NMOS gate 18 over p-type substrate 16 and PMOS gate 20 over n well 14 have also already been formed on gate oxide layer 21 which has also already been created, in the portion of the CMOS integrated circuit shown. The details of the formation of gates 18 and 20 are not discussed herein as they are not particularly pertinent to the instant invention. It is expected that any kind of MOS gate technology would work in conjunction with this invention. It is also expected that the invention would work equally well in the instance of p-type wells formed in an n-type substrate or in twin well fabrication procedures. In addition, it is noted that the vertical proportions of the regions, layers and devices relative to the horizontal dimensions are greatly exaggerated for the purpose of clear illustration.

As mentioned, a cleanly etchable sidewall material 22 is formed in a layer over the entire surface of the wafer. In other words, the sidewall material 22 should be capable of being removed without affecting, in a negative way, the previously formed gate oxide or gate material of gates 18 and 20. In addition, the sidewall material should be capable of being removed without appreciably disturbing any existing resist masks, such as by wet etching or isotropic dry etching. To achieve these goals, the sidewall materials proposed here must be cleanly removable, and may be conductive materials, such as metals or dielectric materials. The method of formation is also not critical, as they may be deposited or selectively grown. For example, aluminum or tungsten that is deposited to form the sidewalls, or tungsten that is grown selectively on the gate top and sidewalls would be suitable. In addition, it is possible to use a chemical vapor deposition polysilicon as the conformal material for sidewall 22 if the polysilicon gates 18 and 20 is first oxidized. Sidewall material 22 must be reasonably conformal to the shape of the gate/substrate interface. For the purposes of this description, "reasonably conformal" simply means that the sidewall material 22 affixes well enough to the edges of gates 18 and 20 in the form of sidewall spacers 24 to perform the masking function during ion implantation of the source/drain regions around the gates. Any cleanly removable chemical vapor deposition (CVD) material would be suitable. Throughout this description, it will be assumed that sidewall material 22 is aluminum for purposes of illustration only, and the invention is not intended to be limited thereby. The removal of the sidewalls 22 may be conducted using any appropriate process including wet etch or isotropic dry etch or an etch process that involves both chemical and physical removal mechanisms, for example.

Figure 1B:
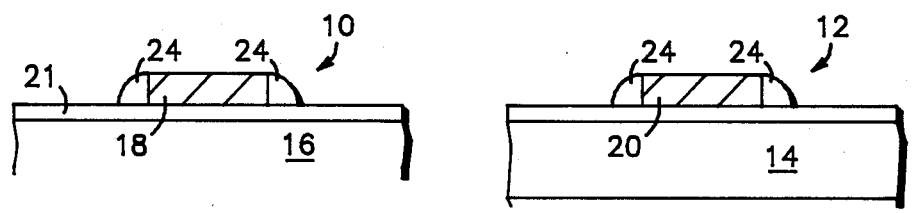

Shown in FIG. 1B are the removable sidewall spacers 24 which are left after the anisotropic etch of the layer of sidewall material 22. If the substance used for sidewall material 22 is not reasonably conformal to the shape of the gates 18 and 20 or cannot be anisotropically etched well, then sidewall spacers 24 will not be optimum. Aluminum deposition is acceptable although a thicker deposited layer would be required which may be undesirable in some circumstances.

Figure 1C:
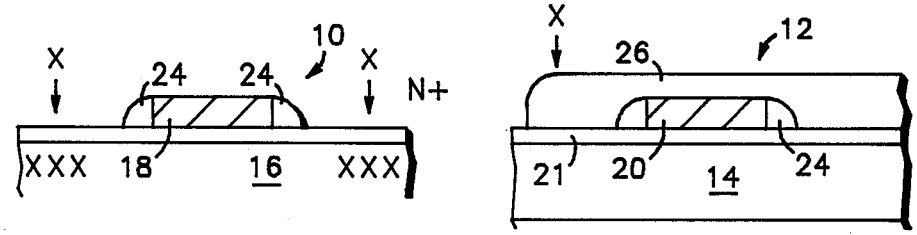

Shown in FIG. 1C is the CMOS circuit under construction, with the PMOS gate 20 protected by barrier material or photoresist layer 26. A mask will be necessary for the application of photoresist layer 26, but as will be noted, this mask is the only one required for the process of this invention. The inventive process is not limited by masking the PMOS devices 12 first rather than the NMOS devices 10. The technique described herein could just as easily be applied by masking the NMOS devices 10 first with photoresist layer 26. However, it is preferred that the PMOS devices are masked first so that the PMOS devices will not be subject to the NMOS device thermal cycle. A protective layer of SiO$_2$ may be grown upon the n-type source/drain regions by known technology as will be described later.

FIG. 1C also shows the implant of the heavily doped n+ regions as represented by the x symbols. The PMOS devices 12 are protected from this implant by photoresist layer 26 and the future LDD regions around NMOS gates 18 are protected by removable sidewall spacers 24. The implant thus occurs along and around sidewall spacer 24 edges.

Figure 1D:
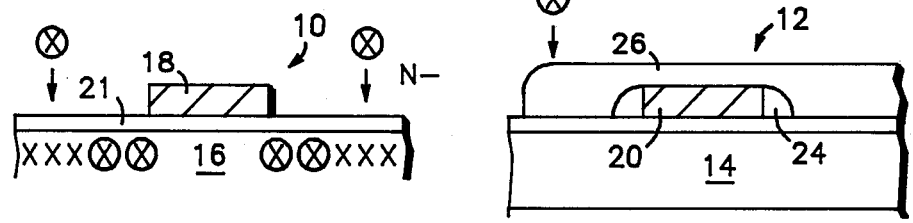

Shown in FIG. 1D are the results of the next steps in the process, which first involves stripping or wet etching the removable sidewall spacers 24 from around the NMOS gates 18. The photoresist layer 26 should remain over the PMOS devices 12 at this point. Next, the lightly doped n$^-$ regions are implanted as represented by the circled x symbols. These n$^-$ regions will self align to the NMOS gate 18 edges.

Figure 1E:
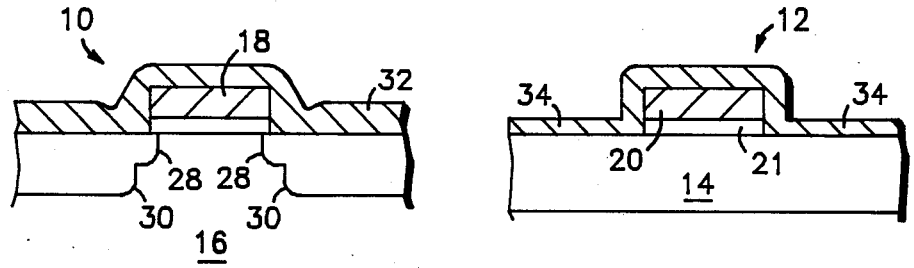

Next, the photoresist layer 26 is stripped and the remaining removable sidewall spacers 24 around the PMOS gates 20 are stripped, the gate oxide layer 21 to the side of the gates 20 may be selectively etched and the surface of the wafer cleaned, as shown. Alternatively, oxide 21 may remain until a later step in the process sequence. Now a thermal drive-in step is performed to drive the n$^-$ and n+ regions to appropriate depths. These regions form LDDs 28 and source/drain regions 30, respectively, as shown in FIG. 1E. This drive-in step is performed in an oxidizing ambient, during or after the source/drain anneal to grow oxide on the n$^-$ and n+ regions that is thicker, by about three to four times than the oxide grown on the n-well regions, i.e. the future source/drain regions of the PMOS 12 devices. This differential oxide growth to give thick thermally grown oxide layer 32 and thin thermally grown oxide layer 34 results from a differential growth rate caused by the n+ implant, and to some extent the n$^-$ implant also. This phenomemon is well known and is taken advantage of here for its ability to selectively mask for the heavy p+ implant that follows. For example, thick oxide layer 32 may be approximately 750 Angstroms thick while thin layer 34 may be about 250 Angstroms thick. These thicknesses are merely presented as representative, as they may range from 400 to 1000 Angstroms or more, and the invention herein is not intended to be limited by these thickness or exact differences in the thicknesses between the two layers. For further information about differential oxide layers, see U.S. Pat. No. 4,474,624, incorporated by reference herein.

Figure 1F:
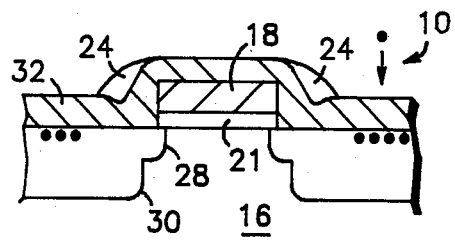
Figure 1F:
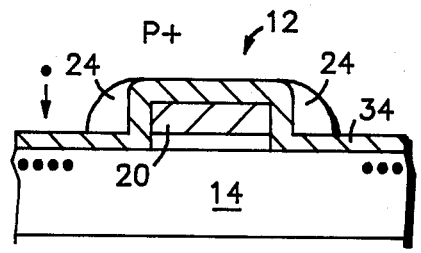

Shown in FIG. 1F is the consequence of the next steps in the process. The removable sidewall spacers 24 are reformed on both the NMOS devices 10 and the PMOS devices 12 by the method described previously. As will be recalled, no mask levels are necessary for the formation of these removable sidewall spacers 24. Next, the heavy p+ implant is performed as represented by the dots. Because the NMOS devices 10 are protected by the thick oxide layer 32, the p+ dopants are implanted into the source/drain regions 30 at a very shallow level if at all. The NMOS LDDs 28 are protected by the presence of sidewall spacers 24. However, because thin layer 34 around the PMOS gates 12 is only about a third as thick as thick layer 32, the p+ impurities are implanted into the future PMOS source/drain regions at a satisfactory level.

Figure 1G:
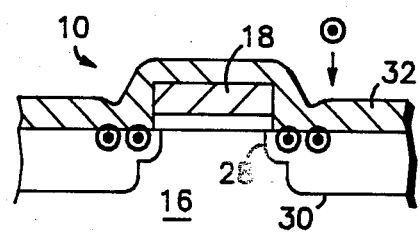
Figure 1G:
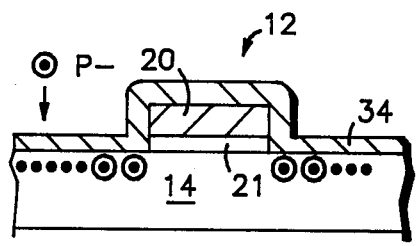

Shown in FIG. 1G are the results of the next steps which include the stripping by wet etch of the removable sidewall spacers 24 and the implant of lightly doped regions p$^-$ as represented by the circled dots. Like the n$^-$ regions, the p$^-$ regions will also self-align to the gates. Once again, the NMOS devices 10 are protected by the thick thermally grown oxide layer 32, while thin oxide layer 34 permits a lightly doped layer to be implanted satisfactorily. The p$^-$ layer is also implanted at sufficiently low energy and dose to not seriously compensate the n$^-$ regions although it is implanted at sufficient energy and dose to serve as p$^-$ layer for the PMOS devices 12.

Figure 1H:
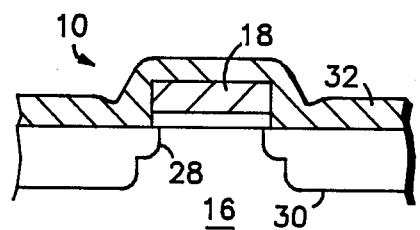
Figure 1H:
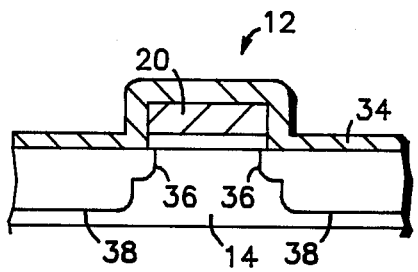

Finally, as shown in FIG. 1H, a second, separate thermal drive-in cycle is performed to activate the p$^-$ and p+ regions to form PMOS LDDs 36 and PMOS source/drain regions 38, respectively. The PMOS devices 12 and NMOS devices 10 shown in FIG. 1H are the finished devices as far as the process of this invention is concerned. Of course, other processing, such as the creation of the ohmic contacts must be conducted.

Figure 2A:
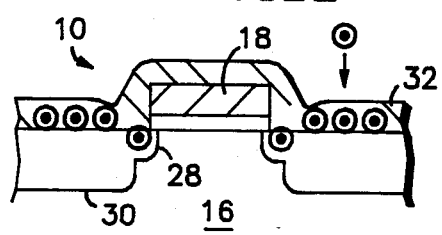
FIGS. 2A through 2C are schematic, cross-sectional illustrations showing the various stages of an alternate embodiment of the process of the invention using temporary and permament sidewall spacers.
Figure 2A:
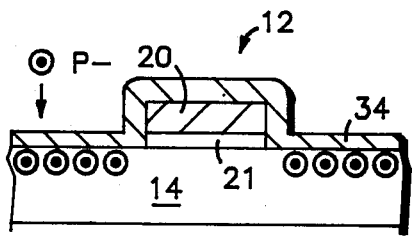
Figure 2B:
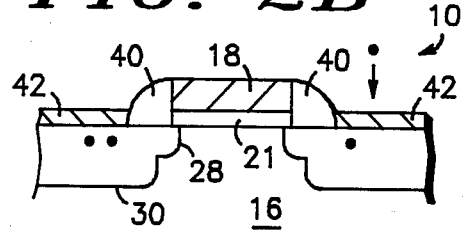
Figure 2B:
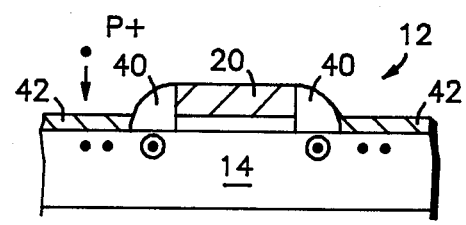
Figure 2C:
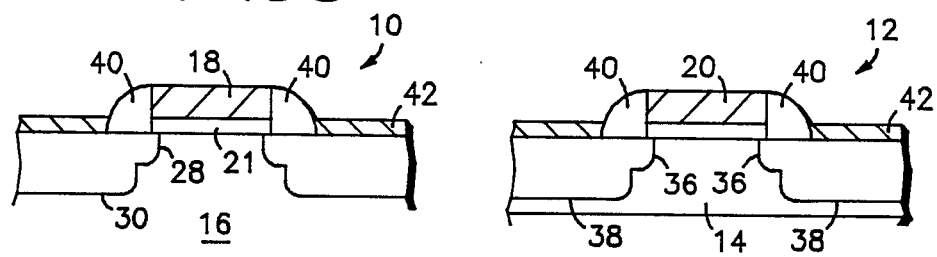

An alternate embodiment of the invention is shown in FIGS. 2A through 2C. In this version, an optional "hard" or permanent spacer is used near the end of the method for silicided devices.

In the optional process, the steps illustrated in FIGS. 1A through 1E are conducted first. As seen in FIG. 2A, the next step is the low energy p$^-$ implant in the absence of an additional sidewall spacer at this point. This procedure is more like that of the prior methods of making LDDs.

Next, as shown in FIG. 2B, a hard mask spacer 40 is formed around gates 18 and 20, by the procedure described earlier after the nearly complete removal of thick oxide layer 32 and thin oxide layer 34. Hard mask spacer 40 may be any relatively permanent dielectric material, such as LPCVD oxide, low temperature oxide, etc. as long as it conforms to the shape of the gates and thus provides the desired sidewall spacer structures 40. Hard mask spacers 40 are used to allow one to use refractory metal silicide interconnects which are subsequently formed.

Subsequently, the heavier implant of p+ impurities is performed through screen oxide layer 42, subsequently formed, as seen in FIG. 2B. The source/drain regions formed are spaced away from the gates by the spacers 40. The dose must be low enough to prevent overcompensation of the n+ regions and formation of a pn junction therein, which is acceptable due to the subsequent employment of silicide.

Finally, the p$^-$ and p+ regions are activated by a thermal drive-in step as before to form PMOS LDDs 36 and PMOS source/drain regions 38. Of course, self-aligned silicide source/drain/gate contacts may be made now with permanent spacers 40 in place.

Figure 3A:
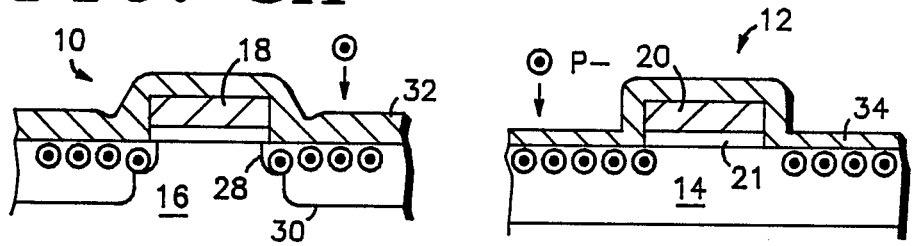
FIGS. 3A through 3C are schematic, cross-sectional illustrations showing the various stages of another alternate technique of this invention which also incorporates permanent sidewall spacers, but which provides a p$^-$ pocket region next to the n-type source/drains.
Figure 3B:
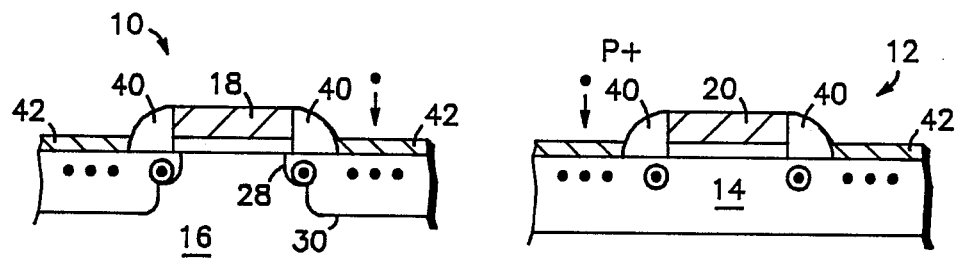
Figure 3C:
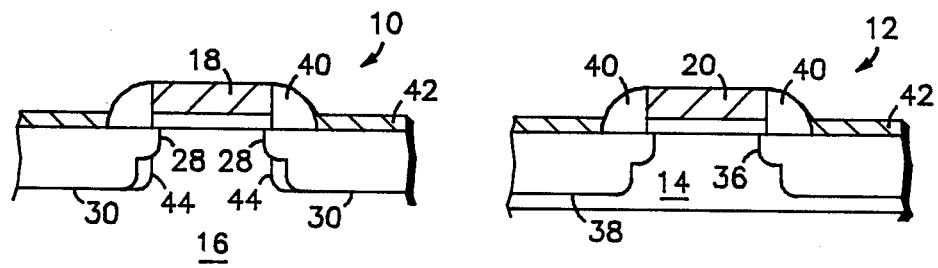

Another optional method of the invention involves the formation of a lightly doped p$^-$ pocket 44 in the NMOS device 10 as shown in FIGS. 3A through 3C. Once again, the inventive process is as described in FIGS. 1A through 1E is performed, but instead of the removable sidewall spacers 24 being reformed as in FIG. 1F, a "high energy" p$^-$ implant is conducted as shown in FIG. 3A by the circled dots which occurs close to the base of the n$^-$ region due to the absence of the sidewall spacers 24. For example, this implant could be performed with boron at 35 KeV. This particular dopant at this implant strength is merely a suggestion and the invention is not intended to be limited thereby.

Shown in FIG. 3B are the results of the next step which is the formation of hard mask permanent spacers 40 as previously discussed about FIG. 2B. As in that alternate process, the implant of the heavily doped p+ region occurs next, as illustrated by the dots, through screen oxide layer 42. When the p− and p+ regions are activated in a thermal drive-in step, the result is PMOS lightly doped drains 36 and PMOS source/drain regions 38 as shown in FIG. 2C, but also p− pocket regions 44, shown deeper than the p− regions 36 on the PMOS device for purposes of illustration. The p− pocket region on NMOS device 10 is beneficial because it provides NMOS short channel effect protection. p− pocket regions such as 44 are known in the literature.

One skilled in the art will appreciate that the alternate procedures outlined in the above discussion with reference to FIGS. 2A–2C and 3A–3C are not limited to procedures using permanent sidewalls. Both "high energy" and "low energy" p− implants may used in connection with the embodiment of this invention that employs only removable sidewall spacers 24 and does not utilize permanent spacers 40 at all. A "high energy" implant is generally defined as one required to penetrate the n− region sufficiently. Further, one skilled in the art will also realize that p− pockets 44 may also be formed using only disposable sidewall spacers 24. Modification of the procedure of this inventio to provide these results is straightforward, now that the invention has been explained. The invention is not limited by the exact embodiments described, but is only limited by the appended claims.

It should be noted that in all of these procedures only one mask level is used and the donor and acceptor regions are driven in in separate thermal cycles allowing the cycles to be custom tailored as needed to each dopant. These advantages are unexpected in a process for introducing LDDs in CMOS integrated circuits. Of course, all the benefits of employing LDDs discussed previously are also obtained.

We claim:

1. A process for forming lightly doped drains (LDDs) on both NMOS and PMOS devices together on a CMOS integrated circuit using only one mask level, comprising the following steps in the following sequence:
    forming gates for NMOS and PMOS devices on an integrated circuit substrate;
    forming disposable, cleanly removable sidewall spacers along the gate edges;
    protecting gates of a first conductivity type by covering them with a disposable barrier material;
    implanting heavily doped source/drain regions along sidewall spacer edges of gates of a second conductivity type, while gates of the first conductivity type are protected by the disposable barrier material;
    removing the disposable sidewall spacer from along the edges of the gates of the second conductivity type;
    implanting LDDs along the gate edges of the second conductivity while the gates of the first conductivity type are protected by a disposable barrier material;
    removing the disposable barrier material;
    driving in the source/drain regions and LDDs along the gate edges of the second conductivity type in a first thermal drive-in cycle in an oxidizing ambient to grow silicon dioxide over the surface of the substrate wherein the oxide over the source/drain regions and LDDs by the gates of the second conductivity type is thicker than the oxide over future source/drain regions by the gates of the first conductivity type;
    reforming disposable, cleanly removable sidewall spacers along the gate edges;
    implanting heavily doped source/drain regions along the edges of the sidewall spacers of gates of the first conductivity type;
    removing all disposable sidewall spacers from along the gate edges;
    implanting LDDs along the gate edges of the first conductivity type; and
    driving in the source/drain regions and LDDs along the gate edges of the first conductivity type in a second thermal drive-in cycle.

2. The process of claim 8 in which only one mask level is employed in the formation of the LDDs.

3. The process of claim 8 in which source/drain regions and LDDs are formed around the gates of the first conductivity type previously protected by the disposable barrier material, after the drive-in step for the source/drain regions around the gates of the second conductivity type.

4. The process of claim 3 in which, after the drive-in step for the source/drain regions around the gates of the second conductivity type, a dielectric is grown in a selectively thick pattern to protect the LDDs and source/- drain regions along the gates of the second conductivity type previously formed, during formation of LDDs and source/drain regions along the edges of gates of the first conductivity type.

5. The process of claim 3 in which, after the drive-in step for the source/drain regions around the gates of the second conductivity type, permanent spacers are formed along all gate edges.

6. The process of claim 1 in which a high energy p− implant is employed to form p− pocket regions.

7. A process for forming lightly doped drains (LDDs) on both NMOS and PMOS devices together on a CMOS integrated circuit using only one mask level comprising the following steps in the following sequence:
    forming gates for NMOS and PMOS devices on p areas and n areas respectively;
    forming disposable, cleanly removable sidewall spacers along the gate edges;
    deposting a resist mask over gates of a first conductivity type;
    implanting heavily doped source/drain regions along the edges of the sidewall spacers of gates of a second conductivity type;
    removing the disposable sidewall spacers from along the gate edges of the second conductivity type;
    implanting LDDs along the gate edges of the second conductivity type;
    stripping the resist mask from the gates of the first conductivity type;
    removing the remaining disposable sidewall spacers;
    driving in the source/drain regions and LDDs along the gate edges of the second conductivity type in a first thermal drive-in cycle in an oxidizing ambient to grow silicon dioxide over the surface of the substrate wherein the oxide over the source/drain regions and LDDs by the gates of the second conductivity type is thicker than the oxide over future source/drain regions by the gates of the first conductivity type;
    reforming disposable, cleanly removable sidewall spacers along the gate edges;

implanting heavily doped source/drain regions along the edges of the sidewall spacers of gates of the first conductivity type;

removing all disposable sidewall spacers from along the gate edges;

implanting LDDs along the gate edges of the first conductivity type; and driving in the source/drain regions and LDDs along the gate edges of the first conductivity type in a second thermal drive-in cycle.

8. The process of claim 7 in which after the drive-in step for the source/drain regions of the second conductivity type, a high energy blanket p⁻ implant is employed before any subsequent sidewall formation to form eventual p⁻ pocket regions.

9. A process for forming lightly doped drains (LDDs) on both NMOS and PMOS devices together on a CMOS integrated circuit using only one mask level comprising the following steps in the following sequence:

first forming gates for NMOS and PMOS devices on p areas and n areas respectively;

next forming disposable, cleanly removable sidewall spacers along the gate edges;

then depositing a resist mask over gates of a first conductivity type;

next implanting heavily doped source/drain regions along the edges of the sidewall spacers of gates of a second conductivity type;

subsequently removing the disposable sidewall spacers from along the gate edges of the second conductivity type;

next implanting LDDs along the gate edges of the second conductivity type;

then stripping the resist mask from the gates of the first conductivity type;

next removing substantially all of the remaining disposable sidewall spacers;

subsequently driving in the source/drain regions and LDDs along the gate edges of the second conductivity type in a first thermal drive-in cycle in an oxidizing ambient to grow silicon dioxide over the surface of the substrate wherein the oxide over the source/drain regions and LDDs by the gates of the second conductivity type is thicker than the oxide over the future source/drain regions by the gates of the first conductivity type;

next implanting LDDs along the gate edges of the first conductivity type;

then forming permanent spacers along the gate edges;

next implanting heavily doped source/drain regions along the gate edges of the first conductivity type; and subsequently driving the source/drain regions and LDDs along the gate edges of the first conductivity type in a second thermal drive-in cycle.

10. The process of claim 9 in which after the drive-in step for the source/drain regions of the second conductivity type, a high energy blanket p⁻ implant is employed before any subsequent sidewall formation to form eventual p⁻ pocket regions.

* * * * *